United States Patent
Iannelli (10) Patent No.: US 7,466,925 B2
(45) Date of Patent: Dec. 16, 2008

(54) DIRECTLY MODULATED LASER OPTICAL TRANSMISSION SYSTEM

(75) Inventor: John Iannelli, San Marino, CA (US)

(73) Assignee: Emcore Corporation, Albuquerque, NM (US)

( * ) Notice: Subject to any disclaimer, the term of this patent is extended or adjusted under 35 U.S.C. 154(b) by 665 days.

(21) Appl. No.: 11/080,721

(22) Filed: Mar. 15, 2005

(65) Prior Publication Data

US 2005/0271396 A1    Dec. 8, 2005

Related U.S. Application Data

(60) Provisional application No. 60/554,523, filed on Mar. 19, 2004.

(51) Int. Cl.
  *H04B 10/04* (2006.01)
(52) U.S. Cl. .................. 398/182; 398/183; 398/188
(58) Field of Classification Search .......... 398/182–201
  See application file for complete search history.

(56) References Cited

U.S. PATENT DOCUMENTS

| | | |
|---|---|---|
| 3,794,841 A | 2/1974 | Cosentino et al. |
| 4,156,206 A | 5/1979 | Comerford et al. |
| 4,466,694 A | 8/1984 | MacDonald |
| 4,704,720 A | 11/1987 | Yamaguchi |
| 4,786,132 A | 11/1988 | Gordon |
| 4,992,754 A | 2/1991 | Blauvelt et al. |
| 5,003,546 A | 3/1991 | Lidgard et al. |
| 5,161,044 A | 11/1992 | Nazarathy et al. |
| 5,172,068 A | 12/1992 | Childs |
| 5,227,736 A | 7/1993 | Tucker et al. |
| 5,252,930 A | 10/1993 | Blauvelt |
| 5,257,124 A | 10/1993 | Glaab et al. |
| 5,424,680 A | 6/1995 | Nazarathy et al. |
| 5,430,569 A | 7/1995 | Blauvelt et al. |
| 5,436,749 A | 7/1995 | Pidgeon, Jr. et al. |
| 5,453,868 A | 9/1995 | Blauvelt et al. |
| 5,485,481 A | 1/1996 | Ventrudo et al. |
| 5,546,281 A | 8/1996 | Poplawski et al. |
| 5,717,533 A | 2/1998 | Poplawski et al. |
| 5,717,804 A | 2/1998 | Pan et al. |
| 5,812,294 A * | 9/1998 | Wilson ................ 398/194 |
| 5,812,716 A | 9/1998 | Ohishi |
| 5,845,030 A | 12/1998 | Sasaki et al. |
| 5,850,305 A * | 12/1998 | Pidgeon ................ 398/193 |
| 5,870,417 A | 2/1999 | Verdiell et al. |
| RE36,820 E | 8/2000 | McGinley et al. |
| 6,122,085 A | 9/2000 | Bitler |

(Continued)

OTHER PUBLICATIONS

Amnon Yariv, "Optical Electronics in Modern Communications" Fifth Edition, The Oxford Series in Electrical and Computer Engineering, Oxford University Press, 1997.

(Continued)

*Primary Examiner*—Dzung D Tran (57) ABSTRACT

An optical transmitter for generating a modulated optical signal for transmission over dispersive fiber optic links in which a broadband analog radio frequency signal input is applied to a modulation circuit for directly modulating a semiconductor laser with the analog signal input. The transmitter may further include a temperature sensor in proximity to the laser and a negative feedback control circuit coupled to the temperature sensor for adjusting the temperature of the laser in response to an output characteristic of the laser, such as linearity.

29 Claims, 8 Drawing Sheets

DIRECTLY MODULATED ANALOG OPTICAL TRANSMITTER BLOCK DIAGRAM

U.S. PATENT DOCUMENTS

| | | | |
|---|---|---|---|
| 6,179,627 | B1 | 1/2001 | Daly et al. |
| 6,207,950 | B1 | 3/2001 | Verdiell |
| 6,220,873 | B1 | 4/2001 | Samela et al. |
| 6,246,965 | B1 | 6/2001 | Cockerham et al. |
| 6,252,693 | B1 | 6/2001 | Blauvelt |
| 6,288,814 | B1 | 9/2001 | Blauvelt et al. |
| 6,356,679 | B1 | 3/2002 | Kapany |
| 6,373,644 | B1 | 4/2002 | Flanders |
| 6,416,937 | B1 | 7/2002 | Flanders et al. |
| 6,446,867 | B1 | 9/2002 | Sanchez |
| 6,480,513 | B1 | 11/2002 | Kapany et al. |
| 6,517,382 | B2 | 2/2003 | Flickinger et al. |
| 6,535,315 | B1 | 3/2003 | Way et al. |
| 6,538,789 | B2 | 3/2003 | Sun |
| 6,661,814 | B1 | 12/2003 | Chapman et al. |
| 6,661,815 | B1 | 12/2003 | Kozlovsky et al. |
| 2005/0036792 | A1* | 2/2005 | Frederiksen et al. ........ 398/193 |
| 2005/0281298 | A1 | 12/2005 | Kupershmidt et al. |
| 2007/0098414 | A1* | 5/2007 | Zhou .......................... 398/194 |

OTHER PUBLICATIONS

R.G. Harrison and D. Yu, "Stimulated Brillouin Scattering", Chapter 0.1, R. Pike and P. Sabatier, eds., Scattering: Scattering and Inverse Scattering in Pure and Applied Science, © 2001, Academic Press, pp. 1-11.

R. Wyatt, W.J. Devlin, "10 kHz Linewidth 1.5 μm InGaAsP External Cavity Laser with 55nm Tuning Range", Electronic Letters, vol. 19, pp. 110-112, 1983.

D.M. Bird et al, "Narrow Line Semiconductor Laser Using Fibre Grating", Electronics Letters, vol. 27, Issue 13, pp. 1115-1116, Jun. 20, 1991.

M. Ziari et al., "High-Speed Fiber-Grating-Coupled Semiconductor Wavelength-Division Multiplexed Laser", CLEO '97, paper CMGI, May 20-22, 1997, Baltimore, MD, p. 27.

M.S. Whalen et al., "Tunable Fibre-Extended-Cavity Laser", Electronics Letters, vol. 23, No. 7, pp. 313-314, Mar. 1987.

C.A. Park et al., "Single-Mode Behavior of a Multimode 1.55 μm Laser With a Fire Grating External Cavity", Electronics Letters, vol. 22, No. 21, pp. 1132-1133, Oct. 9, 1986.

E.E. Bergmann et al., "Dispersion-Induced Composite Second-Order Distortion at 1.5 μm", IEEE Photonics Technology Letters, vol. 3, No. 1, pp. 59-61, Jan. 1991.

C.Y Kuo and E.E. Bergmann, "Erbium-Doped Fiber Amplifier Second-Order Distortion in Analog Links and Electronic Compensation", IEEE Photonics Technology Letters, vol. 3, No. 9, pp. 829-831, Sep. 1991.

C.Y. Kuo, "Fundamental Second-Order Nonlinear Distortions in Analog AM CATV Transport Systems Based on Single Frequency Semiconductor Lasers", Journal of Lightwave Technology, vol. 10, No. 2, pp. 235-243, Feb. 1992.

R. Nagarajan et al., "Millimeter Wave Narrowband Optical Fiber Links Using External Cavity Semiconductor Lasers", Journal of Lightwave Technology, vol. 12, No. 1, pp. 127-136, Jan. 1994.

L. A. Coldren and T. L. Koch, "External-Cavity Laser Design", Journal of Lightwave Technology, vol. LT-2, No. 6, pp. 1045-1051, Dec. 1984.

A. Lidgard and N.A. Olsson, "Generation and Cancellation of Second-Order Harmonic Distortion in Analog Optical Systems by Interferometric FM-AM Conversion", IEEE Photonics Technology Letters, vol. 2, No. 7, pp. 519-521, Jul. 1990.

T. E. Darcie et al., "Fiber-Reflection-Induced Impairments in Lightwave AM-VSB CATV Systems", Journal of Lightwave Technology, vol. 9, No. 8, pp. 991-995. Aug. 1991.

V. Sykes, "External-Cavity Diode Lasers for Ultra-Dense WDM Networks", Lightwave, Mar. 2001.

* cited by examiner

FIG.1

DIRECTLY MODULATED ANALOG OPTICAL TRANSMITTER BLOCK DIAGRAM

FIG. 2

SEMICONDUCTOR LASER CROSS-SECTION: DISTRIBUTED FEEDBACK LASER (DFB) SHOWN; FABRY-PEROT (FP) LASER SIMILAR IN CONSTRUCTION WITH THE EXCEPTION OF THE ELIMINATION OF THE GRATING.

FIG. 3

TYPICAL EXTERNAL CAVITY LASER. EXTERNAL REFLECTOR CAN BE NARROWBAND OR BROADBAND (OPTICALLY), HIGH OR LOW REFLECTIVITY, AND CAN BE ACHIEVED BY MANY METHODS (SIMPLE MIRROR, DIFFRACTION GRATING, FIBER BRAGG GRATING, ETC...). PROPAGATION BETWEEN THE LASER AND THE EXTERNAL REFLECTOR CAN BE EITHER IN FREE-SPACE OR CONFINED IN A WAVEGUIDE.

FIG. 4A

TYPICAL RF PRE-DISTORTION CIRCUIT FOR CORRECTING FIBER-DISPERSION INDUCED SECOND-ORDER DISTORTIONS.

FIG. 4B

TYPICAL RF PRE-DISTORTION CIRCUIT FOR CORRECTING LASER INHERENT THIRD-ORDER DISTORTIONS.

FIG.5

ILLUSTRATION OF THE EFFECTS OF RF PRE-DISTORTION ON A NON-LINEAR LASER TO ACHIEVE A LINEARIZED OPTICAL OUTPUT.

FIG. 7

DIRECTLY MODULATED LASER OPTICAL TRANSMISSION SYSTEM

REFERENCE TO RELATED APPLICATIONS

This application is related to U.S. patent application Ser. No. 10/946,056 filed Sep. 21, 2004, and assigned to the common assignee.

This application claims the benefit of U.S. Provisional Patent Application No. 60/554,523 filed Mar. 19, 2004.

BACKGROUND OF THE INVENTION

1. Field of the Invention

This invention relates to an optical transmission system for analog signals, and in particular to a directly modulated solid-state laser. More particularly, the invention relates to the use of an electronic circuit for providing a linear output from an amplitude modulated transmission device such as a semiconductor laser which has an output distorted from its input due to inherent nonlinearity. The distortion of the nonlinear device is compensated by applying a predistorted signal to the input of the nonlinear device. The predistortion is chosen such that the distortion of the nonlinear device restores the undistorted signal, enabling transmission over long lengths of dispersive fiber optic media at 1550 nm.

2. Description of the Related Art

Directly modulating the analog intensity of a light-emitting diode (LED) or semiconductor laser with an electrical signal is considered among the simplest methods known in the art for transmitting analog signals, such as voice and video signals, on optical fibers. Although such analog transmission techniques have the advantage of substantially smaller bandwidth requirements than digital transmission, such as digital pulse code modulation, or analog or pulse frequency modulation, the use of amplitude modulation may suffer from noise and nonlinearity of the optical source.

For that reason, direct modulation techniques have been used in connection with 1310 nm lasers where the application is to short transmission links that employ fiber optic links with zero dispersion. For applications in metro and long haul fiber transmission links, the low loss of the link requires that externally modulated 1550 nm lasers be used, but such external modulation techniques are complex and expensive. The present invention is therefore addressed to the problem of providing a simple and low cost system for direct modulation of a laser at 1550 nm so that the analog optical output can be used in metro and long haul optical networks using analog transmission.

Direct modulation of lasers at 1550 nm is known for use in digital optical transmission systems such as dense wavelength division multiplexing (DWDM) systems. See, for example, Kartalopoulos, DWDM Networks, Devices, and Technology (IEEE Press, 2002).

One of the difficulties in designing an analog system at 1550 nm is that suitable low chirp lasers for use at 1550 nm are not known in the prior art. One type of low chirp laser is the external cavity laser, which is used in digital optical transmission systems, and is a commercially available product.

In addition to the low chirp characteristics required for an analog optical transmission system at 1550 nm, the system must be highly linear. Distortion inherent in certain analog transmitters prevents a linear electrical modulation signal from being converted linearly to an optical signal, and instead causes the signal to become distorted. These effects are particularly detrimental to multi-channel video transmission, which requires excellent linearity to prevent channels from interfering with each other. A highly linearized analog optical system has wide application in commercial analog systems, such as broadcast TV transmission, CATV, interactive TV, and video telephone transmission.

Linearization of optical and other nonlinear transmitters has been studied for some time, but proposed solutions suffer from practical disadvantages. Most applications discussed above have bandwidths, which are too large for many practical implementations. Feedforward techniques require complex system components such as optical power combiners and multiple optical sources. Quasi-optical feedforward techniques suffer from similar complexity problems and further require extremely well matched parts.

One method employed in the past to reduce distortion inherent in lasers or other nonlinear devices has been the use of predistortion circuits. In this technique, a modulation signal is combined with a signal equal in magnitude to the distortion inherent in the nonlinear device but opposite in sign. When the nonlinear device modulates the combined signal, the device's inherent distortion is canceled by the combined signal's predistortion and only the linear part of the source signal is transmitted. This predistortion signal is usually in the form of additive and subtractive combinations of the input fundamental frequencies, as these intermodulation products constitute the most fertile source of distortion in analog signal transmission. In the distribution of AM signals for cable television, for example, there are often as many as 100+ frequencies on a particular band and numerous opportunities for second order and third order intermodulation products of those frequencies.

These predistortion techniques have been used in current 1310 nm optical transmitters and are exemplified by U.S. Pat. No. 6,288,814, which is hereby incorporated by reference.

Some of the early predistortion techniques generally divide an input signal into two or more electrical paths and generate predistortion on one or more of the paths resembling the distortion inherent in the nonlinear transmitting device. The generated predistortion is the inverse of the nonlinear device's inherent distortion and serves to cancel the effect of the device's inherent distortion when recombined with the input signal.

Attenuation can be used to match the magnitude of the predistortion to the magnitude of the device's inherent distortion characteristics before the signals are recombined and sent to the nonlinear device for modulation. However, the method suffers from crudeness because nonlinear devices frequently have amplitude and phase distortion characteristics dependent on the frequency of the modulating signal. More recent techniques provide means for compensating for these frequency-dependent nonlinearities.

Neglecting to correct for the frequency dependence of the distortion leads to a result that may be quite tolerable for many systems and for signals with relatively narrow bandwidth. However, they become particularly troublesome when converting an electrical TV signal to an optical signal for cable transmission. Such signals for cable TV may have forty or more input frequencies, all of which need to have high quality amplitude modulated signals. The transmission devices for such signal must have an exceptionally high degree of linearity.

Advanced multi-path predistortion circuits are flexible and highly effective for linearizing output of a wide range of nonlinear devices. One such multi-path predistortion circuit is disclosed in U.S. Pat. No. 4,992,754, issued to Blauvelt et al. The circuit is capable of generating frequency specific distortion products for compensating frequency-dependent nonlinearities, and is useful for applications requiring an exceptionally high degree of linearity, such as, for example, CATV applications.

Although multi-path predistortion circuits can be used in a broad variety of applications, the design of these circuits is relatively complex. This complexity manifests itself in circuits that are often too expensive for applications needing only a modest degree of linearization. One skilled in the art would appreciate a low-cost circuit of relatively simple design for limited application, particularly if such a circuit were fabricated from existing low-cost components commonly used in signal transmission applications.

Circuits as described here could produce frequency dependent third-order distortion. Simple third-order distortion, such as that produced by an ideal diode, has the property that the distortion is real and independent of frequency. Many non-linear transmitters or amplifiers, however, contain reactive elements such as inductances, capacitances or delays, which cause the device to produce distortion depending on the input and output frequencies and the distortion frequencies. Nazarathy, U.S. Pat. No. 5,161,044, discloses a circuit in FIG. 15 of that patent which produces essentially real, frequency-independent predistortion. The capacitors and inductors in Nazarathy are added for biasing purposes and to block the DC and AC currents. However, the circuit disclosed by Nazarathy may not have the right phase or frequency dependence for each set of input frequencies, to be substantially the same in magnitude and opposite in sign to the distortion produced by the non-linear device.

The present invention accordingly is addressed to overcoming these and other difficulties found in designing and operating 1550 nm laser analog optical transmission systems.

SUMMARY OF THE INVENTION

1. Objects of the Invention

It is an object of the present to provide an improved optical transmission system using a directly modulated laser.

It is another object of the present invention to provide a low chirp laser for use in a 1550 nm analog optical transmission system.

It is also another object of the present invention to provide a predistortion circuit for use in a 1550 nm analog optical transmission system.

It is still another object of the present invention to provide a low chirp, highly linear analog optical transmission system suitable for long haul dispersive optical fiber media.

It is still another object of the present invention to provide a feedback circuit for controlling a low chirp laser in an analog optical transmission system suitable for long haul dispersive optical fiber media.

It is also an object of the present invention to provide a direct modulation and distortion compensation process in a broadband analog optical transmission system.

2. Features of the Invention

Briefly, and in general terms, the present invention provides an optical transmitter for generating a modulated optical signal for transmission over a dispersive fiber optic link to a remote receiver having an input for receiving a broadband analog radio frequency signal input; a semiconductor laser for producing an optical signal; and a modulation circuit for directly modulating the laser with the analog signal, including a predistortion circuit for reducing the distortion in the signal present at the receiver end of the fiber optic link.

In another aspect, the present invention provides an optical transmission system for use over dispersive fiber optic links including an optical transmitter with analog signal input; a low chirp laser; a modulation circuit for directly modulating the laser, and a predistortion circuit for reducing the frequency independent component of the distortion of the semiconductor laser.

In another aspect, the present invention further provides a low-cost direct modulation technique, preferably including a predistortion circuit for reducing second and higher order distortion products produced by a nonlinear device such as a laser.

In another aspect of the invention, the present invention provides a low chirp laser as an external cavity laser operating in the 1530 nm to 1570 nm range in the "C band".

In another aspect of the invention, there is provided a predistortion circuit for reducing distortion in the transmission of analog signals that splits an input modulation signal into two electrical paths, one primary and one secondary. A predistortion amplifier on the secondary path generates second order or higher order intermodulation distortion products of the input signal. The distortion so generated, or predistortion, is adjusted to be substantially equal in magnitude and opposite in sign to the distortion inherent in a nonlinear modulation device to which the signal is applied. The predistortion signal is adjusted in amplitude and phase to match the frequency dependence of the distortion by the nonlinear device. The phase of the signals are synchronized by a delay or phase adjustment element in one of the electrical paths. The primary and secondary signals are then recombined to produce a single modulation signal including intermodulation product distortion. Thus, the predistortion circuit largely linearizes the transmission of modulating signals by canceling distortion inherent in nonlinear transmitting devices, making the analog signals suitable for transmission over dispersive fiber optic links.

Additional objects, advantages and novel features of the present invention will become apparent to those skilled in the art from this disclosure, including the following detail description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of significant utility.

BRIEF DESCRIPTION OF THE DRAWINGS

These and other features and advantages of this invention will be better understood and more fully appreciated by reference to the following detailed description when considered in conjunction with the accompanying drawings, wherein.

The novel features and characteristics of the invention are set forth in the appended claims. The invention itself, however, as well as other features and advantages thereof, will be best understood by reference to a detailed description of a specific embodiment, when read in conjunction with the accompanying drawings.

DETAILED DESCRIPTION OF THE PREFERRED EMBODIMENT

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments nor the relative dimensions of the depicted elements, and are not drawn to scale.

Figure 1:
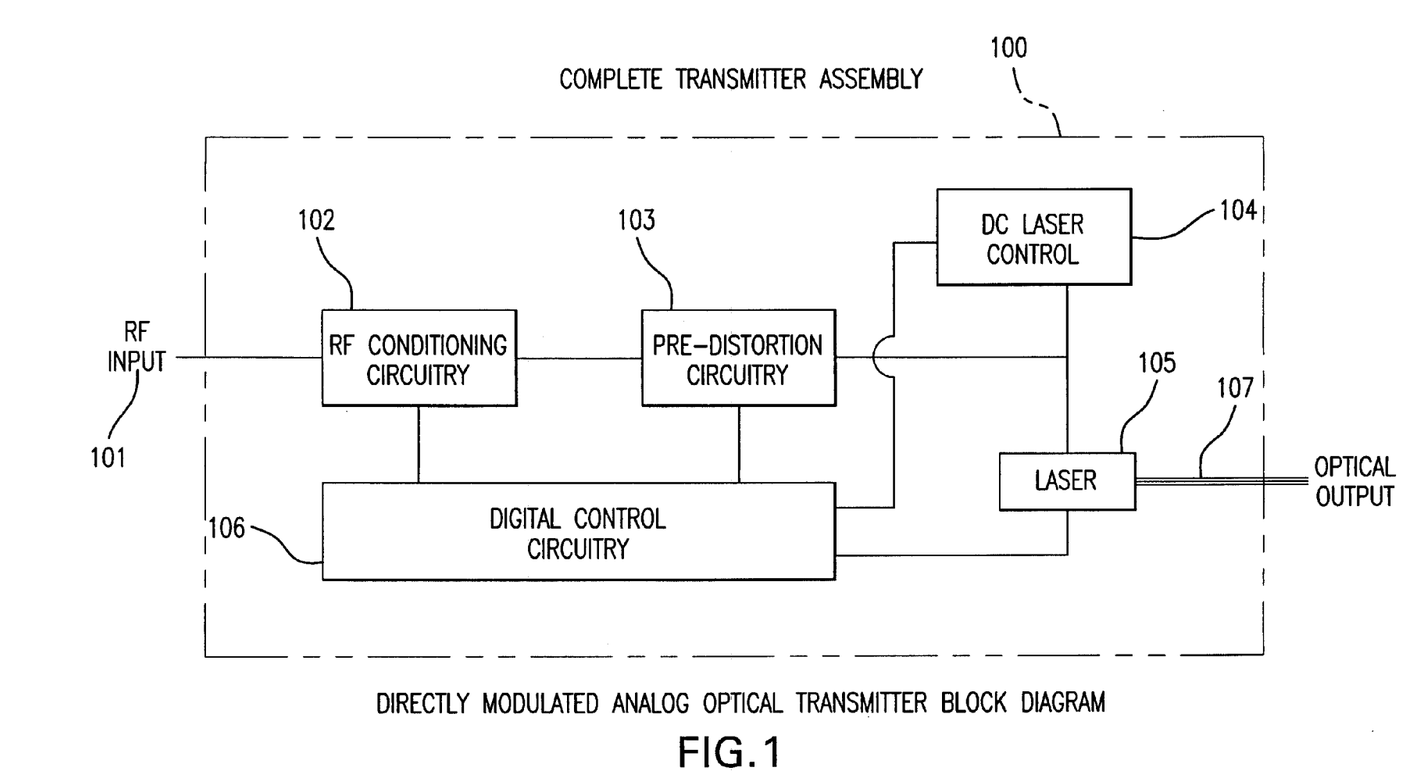
FIG. 1 is a highly simplified block diagram of the optical transmission system according to the present invention.

FIG. 1 is a highly simplified block diagram of the optical transmission system 100 according to the present invention. There is shown an analog RF signal input source 101, such as a broadband signal including a plurality of distinct information-containing communications signals or channels. The RF input is applied to RF conditioning circuitry 102 that performs . . . . The output of the RF conditioning circuitry 102 is applied to a pre-distortion circuit 103 as will be described in more detail in FIG. 4. The pre-distortion circuit 103 provides a control signal to a DC laser driver or control circuit 104, which is applied to the laser 105 and controls the optical fiber output 107. Digital control circuitry 106 also controls the control circuit 104 and the laser 105. The optical fiber output 107 is a dispersive fiber optic link.

Figure 2:
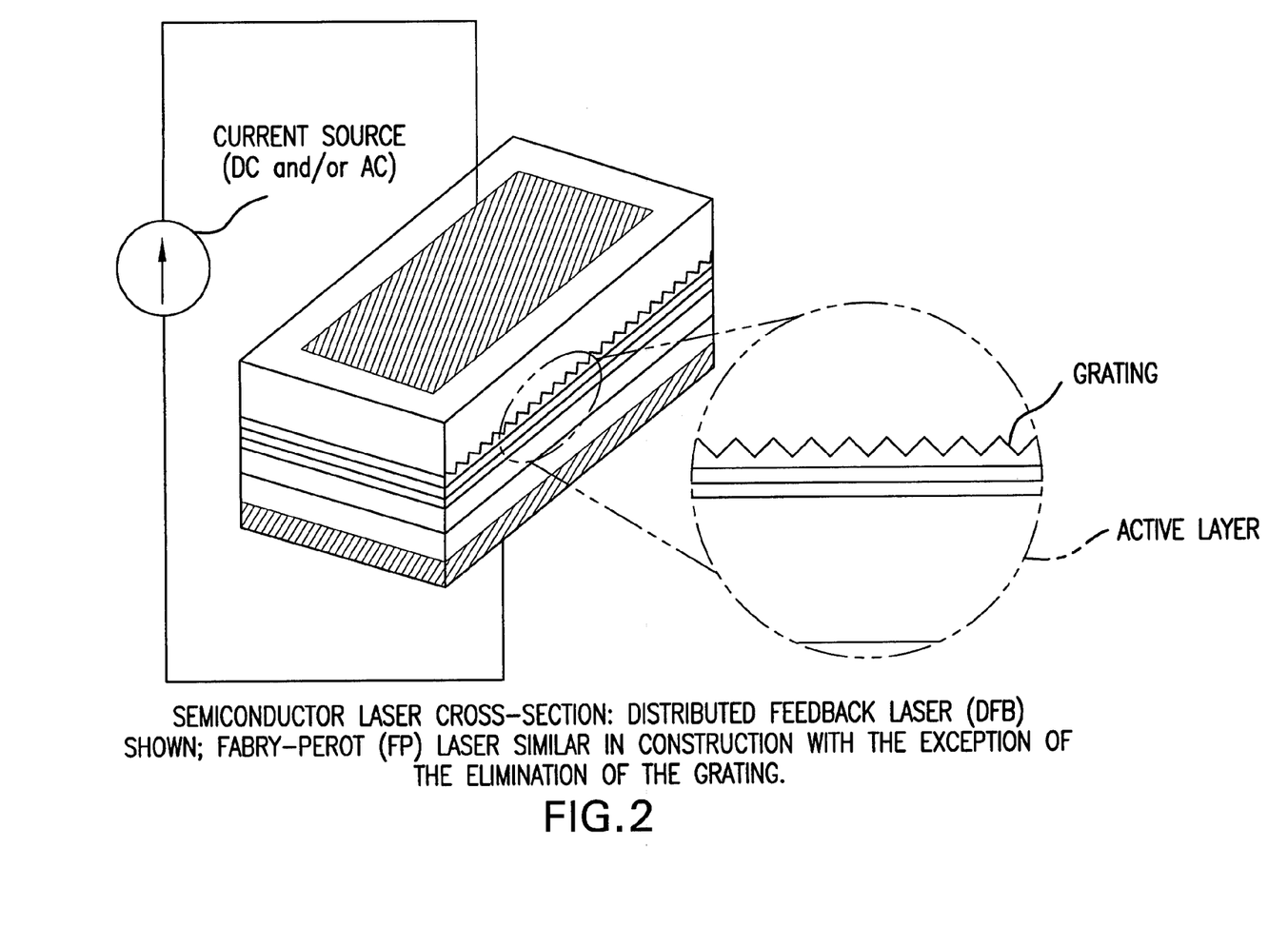
FIG. 2 is a cross sectional view of the semiconductor laser used in the system of FIG. 1.

FIG. 2 is a cross sectional view of the edge-emitting semiconductor laser used in the system of FIG. 1. A distributed feedback laser (DFB) is illustrated, although a Fabry-Perot (FP) laser may be used as well. An FP laser would not have the grating shown in FIG. 2.

Figure 3:
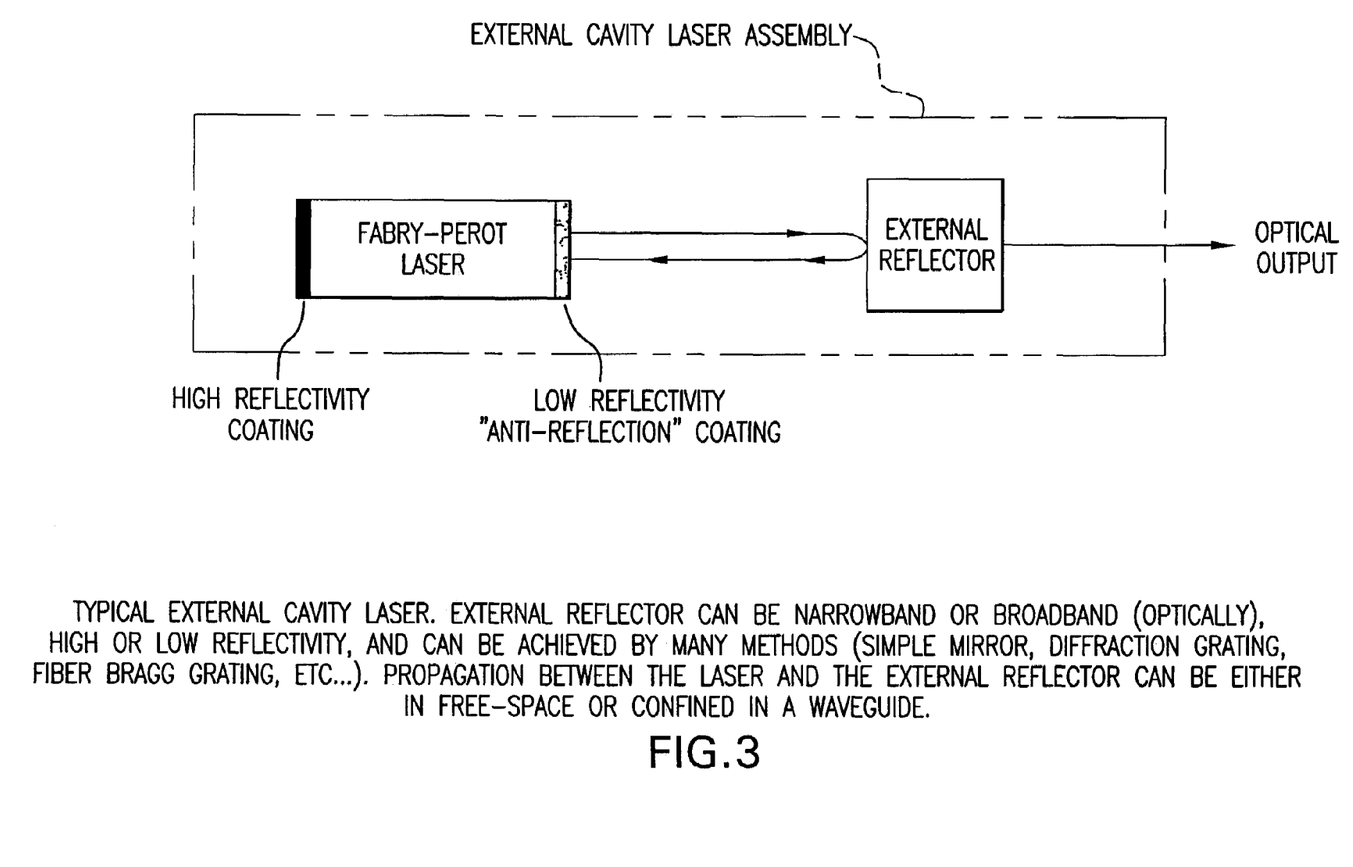
FIG. 3 is a block diagram of an external cavity laser known in the prior art.

FIG. 3 is a block diagram of an external cavity laser known in the prior art. The external reflector can be optically either narrowband or broadband. The implementation may be by mirror, diffraction grating, fiber Bragg grating, or any other suitable technique. The propagation between the laser and the external reflector can be either in free space or confined in a waveguide.

In a preferred embodiment, the laser is an external cavity laser within the wavelength of the light output of the laser in the 1530 to 1570 nm range. Moreover, the broadband analog signal input has a bandwidth greater than one octave and includes a plurality of distinct information carrying channels.

The predistortion circuit of the present invention compensates for the nonlinear response of the laser, and/or for the distortion produced by the transmission of a frequency modulated optical signal through a dispersive fiber optic link as determined at the receiver end. The predistortion circuit may be selectively adjustable to compensate for the distortion produced by the dispersive fiber optic link depending upon the length of the link, or may be factory set to a predetermined value to compensate for the distortion produced by the dispersive fiber optic link depending upon the length of the link.

The modulation circuit may further include a low frequency signal modulator which applies a low frequency signal to the input of the laser to increase the stimulated Brillouin scattering threshold of the dispersive fiber optic link.

In another aspect of the invention, the predistortion circuit may include a plurality of in-line distortion producing circuit elements placed in sequence along the analog signal path such that by additively combining the distortion contributions from the combination of in-line distortion producing circuit elements an appropriate real and imaginary distortion is synthesized in the circuit to an extent sufficient to substantially cancel or reduce the distortion from the nonlinearity of the laser, and wherein no separation of the analog signal into a fundamental signal path and a separate and distinct distortion producing path occurs within the in-line distortion producing circuit elements.

The modulation circuit of the invention may also be an AM-VSB modulator, or a quadrature amplitude modulator.

There is a output "spectral shaping" device connected to the output of the semiconductor laser for adjusting the optical spectrum so that the power is below that of the stimulated Brillouin scattering threshold of the dispersive fiber optic link, such as a phase modulator, a lithium niobate phase modulator, or a piezoelectric phase modulator.

Figure 4A:
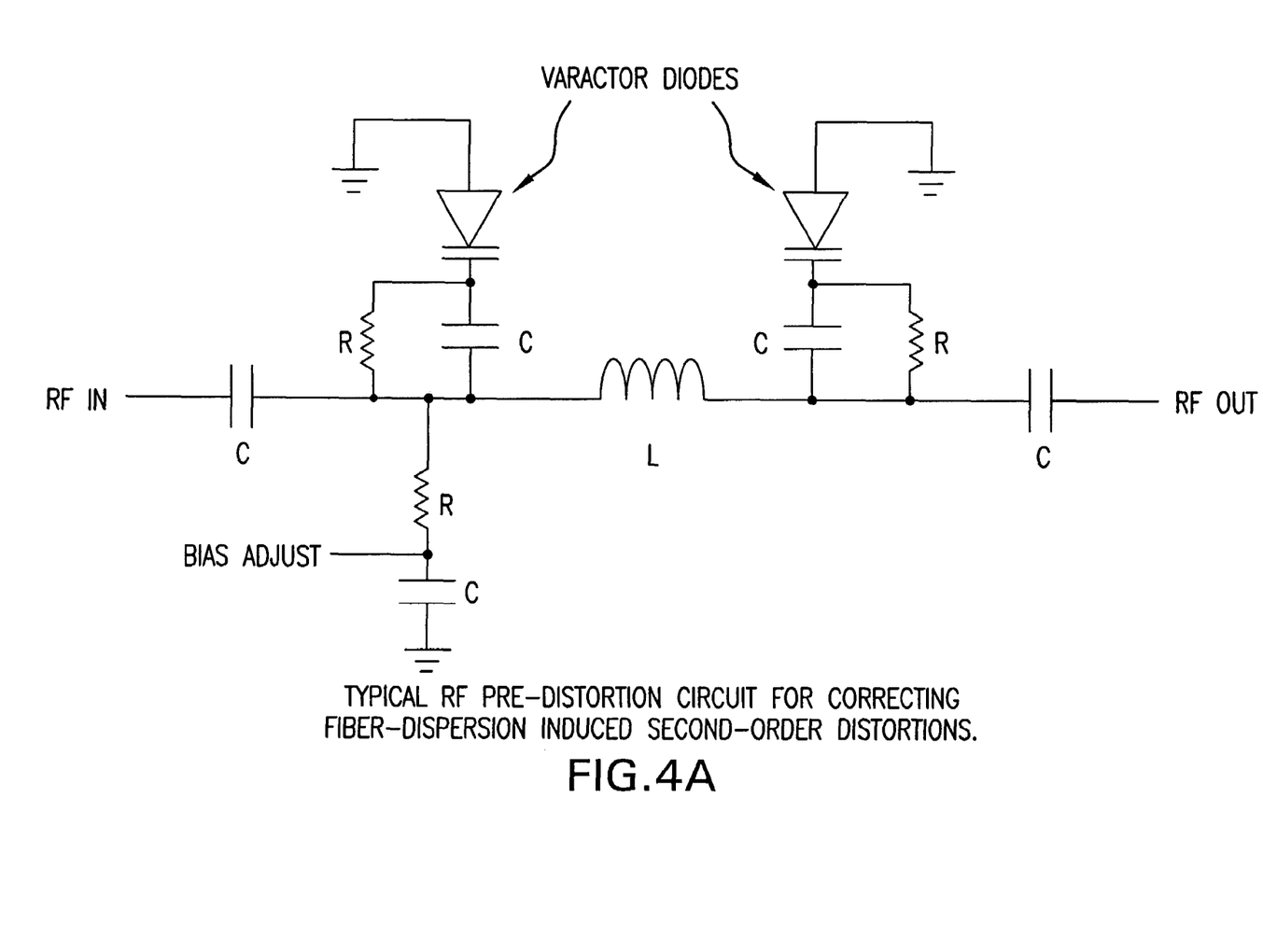
FIGS. 4a and 4b are block diagrams showing a presently preferred embodiment of a predistortion circuit used in the system of FIG. 1.
Figure 4B:
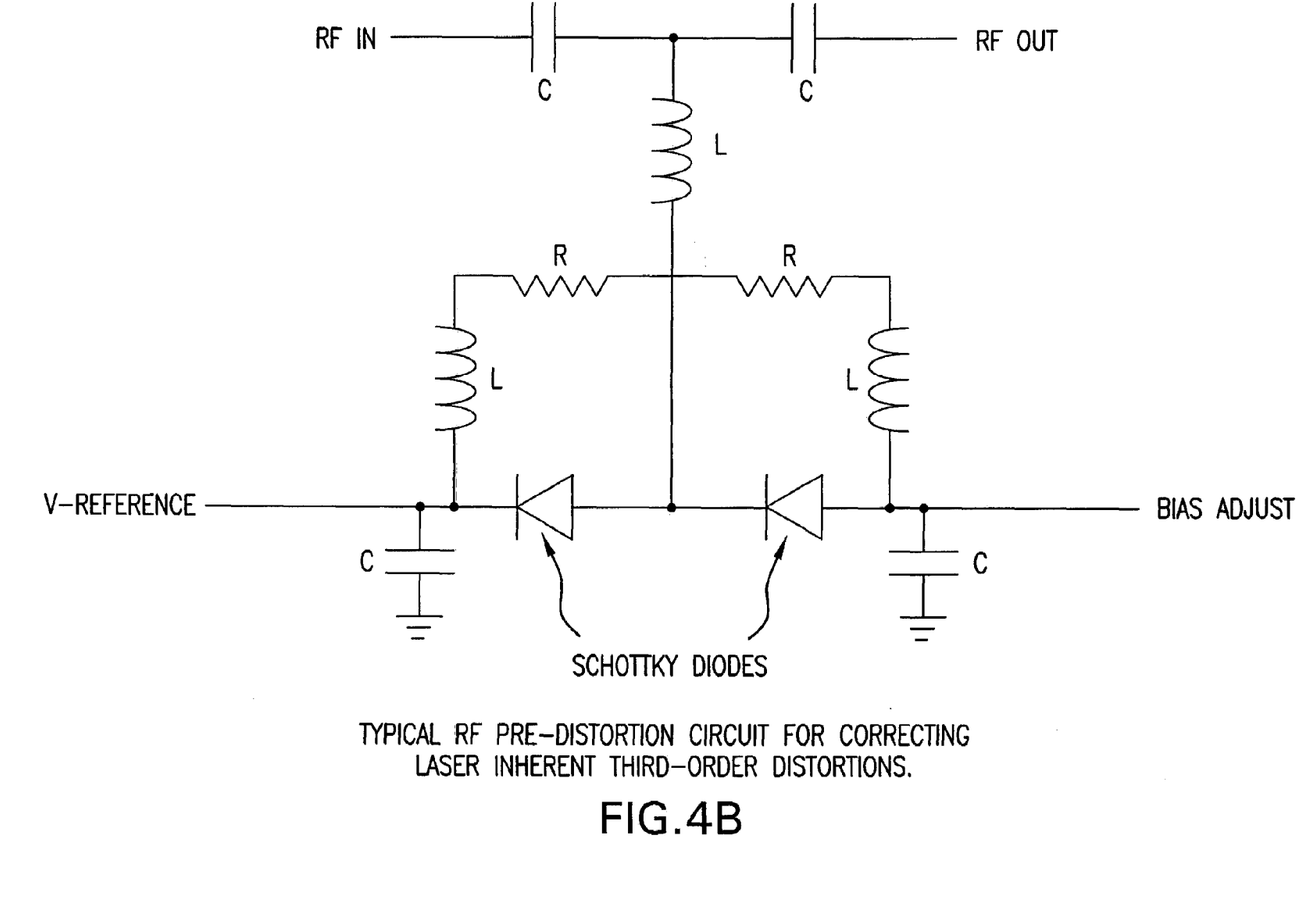

FIGS. 4a and 4b are highly simplified circuit diagrams showing a presently preferred embodiment of a predistortion circuit used in the system of FIG. 1. More particularly, FIG. 4a shows a circuit for correcting fiber-dispersion induced second order distortions, and 4b a circuit for correcting laser inherent third order distortion.

An exemplary transmission device may be a semiconductor laser or LED modulated by the output signal.

Many variations and modifications will be apparent to those skilled in the art without departing from the spirit and scope of the invention. For example, although described and illustrated in the context of a TV signal modulating a laser or light emitting diode, other nonlinear devices such as amplifiers may have inherent distortion largely cancelled by this technique. The fine adjustment of the relative phase of the signals in the primary and secondary paths is in the secondary path in the illustrated embodiment, but this could also be in the primary path with the coarse adjustment. The secondary path is preferred since such a delay in the primary path may have an inappropriate impedance for this path.

Figure 5:
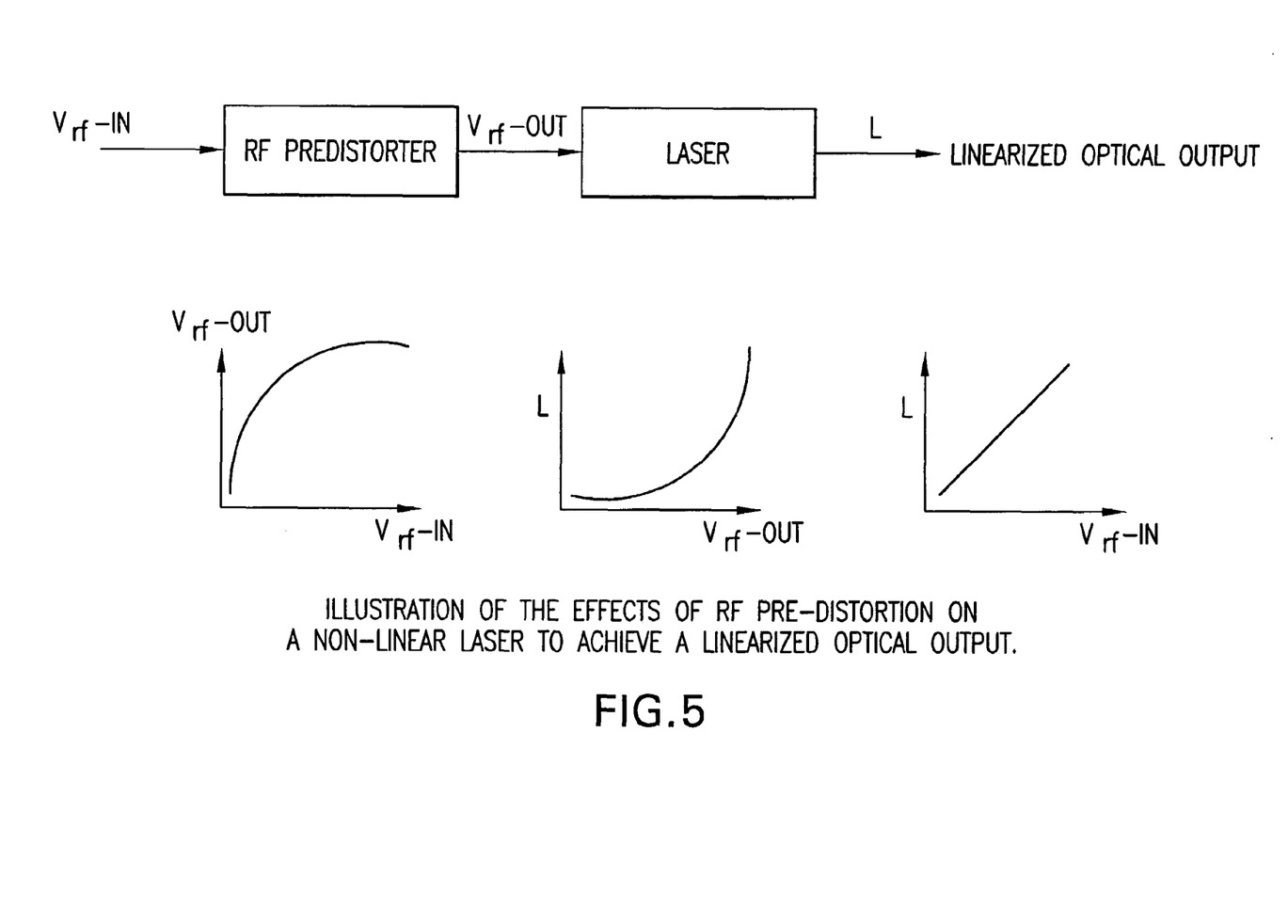
FIG. 5 is an illustration of the effect of predistortion on the waveforms of a modulation signal.

FIG. 5 is an illustration of the effect of predistortion on the waveforms of a modulation signal. The top portion of the Figure represents the sequence of components in the system according to the present invention which a RF signal is processed, and the corresponding voltage diagrams in the low half of the Figure represent the output voltage as a function of the input voltage.

Figure 6:
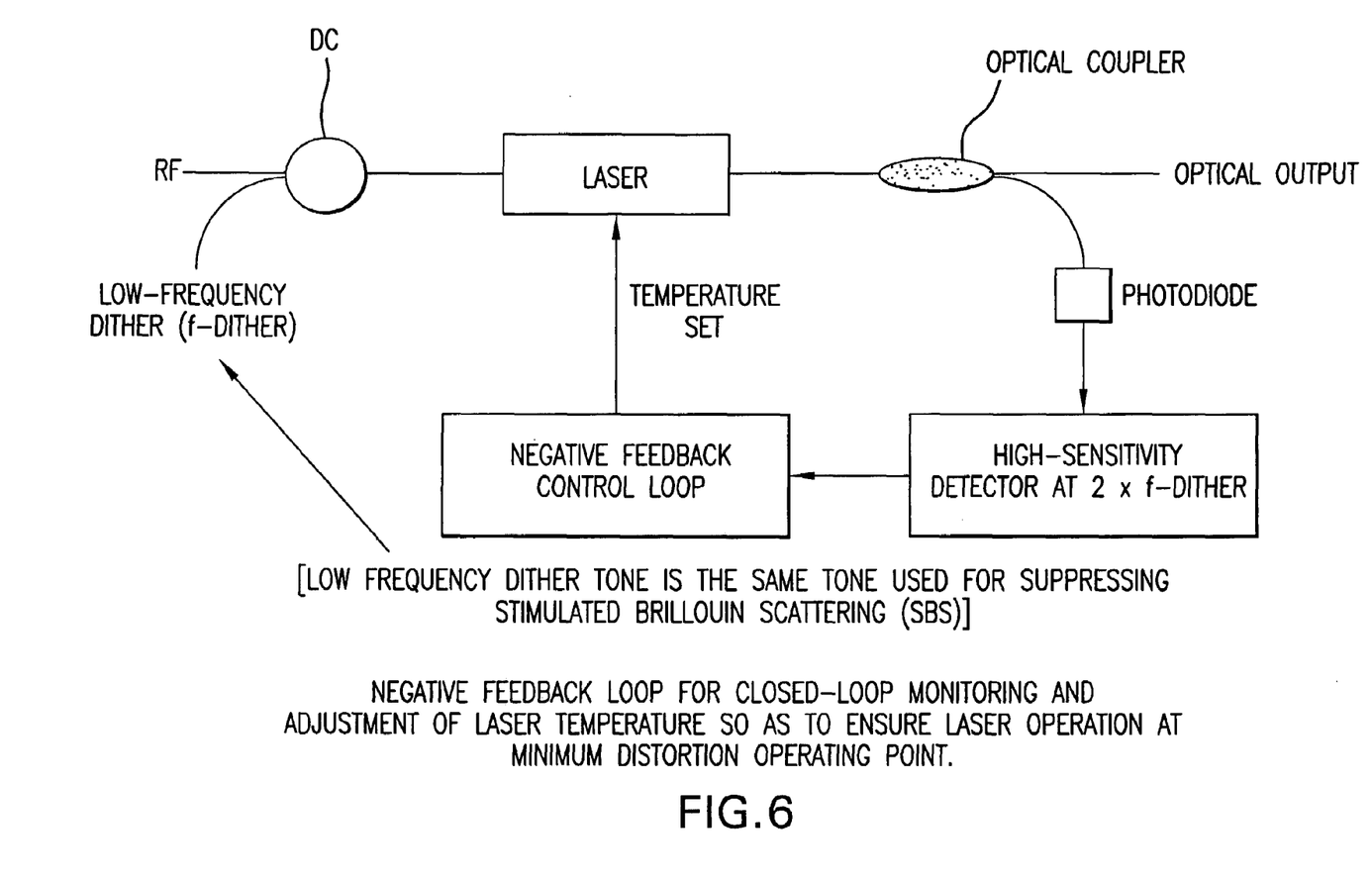
FIG. 6 is a block diagram of a negative feedback loop for adjusting the Laser temperature to ensure operation at a minimum or optimum distortion operating point.
Figure 7:
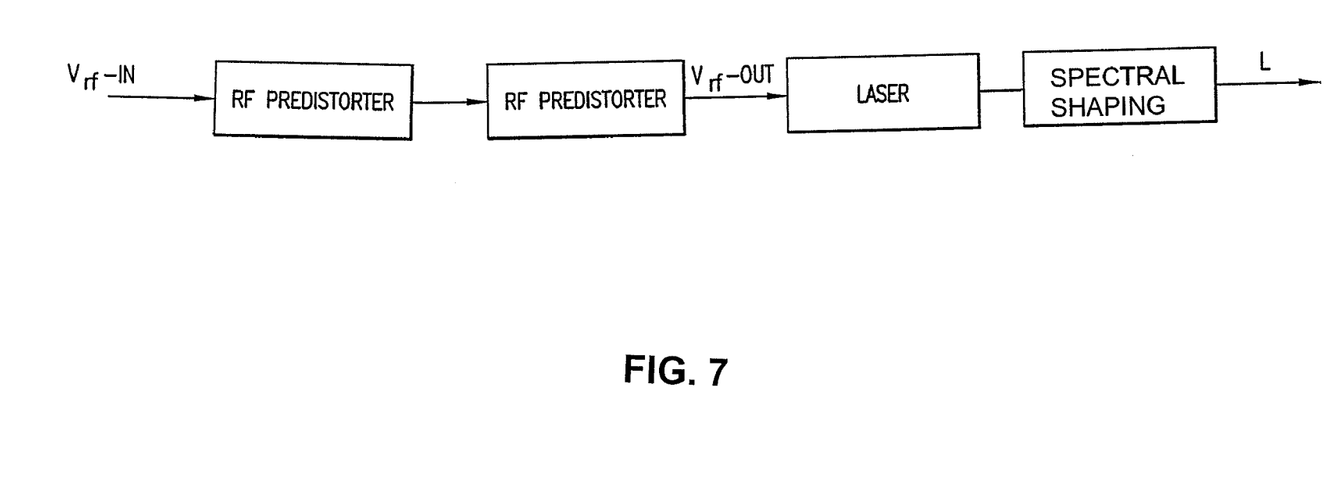
FIG. 7 is a block diagram of an optical transmission system showing a number of in-line distortion producing circuit elements and an output spectral shaping means.

FIG. 6 is a block diagram of a negative feedback loop for adjusting the laser temperature to ensure operation at a minimum or optimum distortion operating point.

The figure assumes the use of a temperature controller in proximity to the laser for controlling the temperature of the laser to minimize the distortion present at the receiver end of the fiber optic link. The temperature controller is typically a Peltier thermoelectric cooler as is known in the art. There are a number of physical parameters associated with a laser that vary with temperature. In applications where these variables are critical, it is important to be able to control the actual temperature of the laser regardless of the external environment temperature. The present invention monitors the output of the laser with a photodiode, converts the signal in a control signal, which is coupled to a laser output monitor control circuit, including a negative feedback control circuit coupled to the temperature controller for adjusting the temperature of the laser in response to the output of the laser.

Various aspects of the techniques and apparatus of the present invention may be implemented in digital circuitry, or in computer hardware, firmware, software, or in combinations of them. Circuits of the invention may be implemented in computer products tangibly embodied in a machine-readable storage device for execution by a programmable processor, or on software located at a network node or web site which may be downloaded to the computer product automatically or on demand. The foregoing techniques may be performed by, for example, a single central processor, a multi-processor, one or more digital signal processors, gate arrays of logic gates, or hardwired logic circuits for executing a sequence of signals or program of instructions to perform functions of the invention by operating on input data and generating output. The methods may advantageously be implemented in one or more computer programs that are executable on a programmable system including at least one programmable processor coupled to receive data and instructions from, and to transmit data and instructions to, a data storage system, at least one in/out device, and at least one output device. Each computer program may be implemented in a high-level procedural or object-oriented programming language, or in assembly or machine language if desired; and in any case, the language may be compiled or interpreted language. Suitable processors include, by way of example, both general and special purpose microprocessors. Generally, a processor will receive instructions and data from read-only memory and/or random access memory. Storage devices suitable for tangibly embodying computer program instructions and data include all forms of non-volatile memory, including by way of example, semiconductor devices, such as EPROM, EEPROM, and flash memory devices; magnetic disks such as internal hard disks and removable disks; magneto-optical disks; and CD-ROM disks. Any of the foregoing may be supplemented by or incorporated in, specially designed application-specific integrated circuits (ASICS).

It will be understood that each of the elements described above, or two or more together, also may find a useful application in other types of constructions differing from the types described above.

While the invention has been illustrated and described as embodied in an optical transmission system, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed is:

1. An optical transmitter for generating a modulated optical signal for transmission over a dispersive fiber optic link to a remote receiver comprising:
   an input for receiving a broadband analog radio frequency signal input;
   a semiconductor external cavity laser for producing an optical signal to be transmitted over an optical fiber;
   a modulation circuit for directly modulating the laser with the analog signal, including a predistortion circuit for reducing the distortion in the signal present at the receiver end of the fiber optic link; and
   a spectral shaping device connected to an output of the laser for adjusting an optical spectrum so that a power output of the laser is below a stimulated Brillouin scattering threshold of the fiber optic link.

2. A transmitter as defined in claim 1 wherein the wavelength of the light output of the laser is in the 1530 to 1570 nm range.

3. A transmitter as defined in claim 1 wherein the broadband analog signal input has a bandwidth greater than one octave and includes a plurality of distinct information carrying channels.

4. A transmitter as defined in claim 1 wherein the predistortion circuit compensates for the nonlinear response of the laser.

5. A transmitter as defined in claim 1 wherein the predistortion circuit compensates for the distortion produced by the transmission of a frequency modulated optical signal through a dispersive fiber optic link as determined at the receiver end.

6. A transmitter as defined in claim 1 wherein the predistortion circuit is selectively adjustable to compensates for the distortion produced by the dispersive fiber optic link depending upon the length of the link.

7. A transmitter as defined in claim 1 wherein the predistortion circuit is factory set to a predetermined value to compensate for the distortion produced by the dispersive fiber optic link depending upon the length of the link.

8. A transmitter as defined in claim 1 wherein the modulation circuit further includes a low frequency signal modulator to increase the stimulated Brillouin scattering threshold of the dispersive fiber optic link.

9. A transmitter as defined in claim 1 wherein the predistortion circuit includes a plurality of in-line distortion producing circuit elements placed in sequence along the analog signal path such that by additively combining the distortion contributions from the combination of in-line distortion producing circuit elements an appropriate real and imaginary distortion is synthesized in the circuit to an extent sufficient to substantially cancel or reduce the distortion from the nonlinearity of the laser, and wherein no separation of the analog signal into a fundamental signal path and a separate and distinct distortion producing path occurs within the in-line distortion producing circuit elements.

10. A transmitter as defined in claim 1 wherein the modulation circuit is an AM-VSB modulator.

11. A transmitter as defined in claim 1 wherein the modulation circuit is a quadrature amplitude modulator.

12. A transmitter as defined in claim 1 further comprising output spectral shaping adjustment means connected to the output of the semiconductor laser for adjusting the average output power of the optical carrier signal so that the power is below that of the stimulated Brillouin scattering threshold of the dispersive fiber optic link.

13. A transmitter as defined in claim 12 wherein the output spectral shaping adjustment means is a phase modulator.

14. A transmitter as defined in claim 12 wherein the output spectral shaping adjustment means is a lithium niobate phase modulator.

15. A transmitter as defined in claim 12 wherein the output spectral shaping adjustment means is a piezoelectric phase modulator.

16. An optical transmitter for generating a modulated optical signal for transmission over a dispersive fiber optic link to a remote receiver comprising:
   an input for receiving a broadband analog radio frequency signal input;
   a semiconductor laser for producing an optical signal to be transmitted over an optical fiber;
   a modulation circuit for directly modulating the laser with the analog signal;

a temperature sensor in proximity to the laser for monitoring the temperature of the laser, and a control circuit coupled to the temperature sensor for adjusting the temperature of the laser in response to an optical output characteristic of the laser.

17. A transmitter as defined in claim 16 wherein the output characteristic of the laser is the linearity of the optical signal as a function of the input signal to the laser.

18. A transmitter as defined in claim 16 wherein the output characteristic of the laser is measured by using a pilot tone as an input to the laser and examining the intermodulation product at the output to determine the linearity of the output signal as a function of the input signal to the laser.

19. A transmitter as defined in claim 16 wherein the laser is an external cavity laser.

20. A transmitter as defined in claim 16 wherein the wavelength of the light output of the laser is in the 1530 to 1570 nm range.

21. A transmitter as defined in claim 16 wherein the broadband analog signal input has a bandwidth greater than one octave and includes a plurality of distinct information carrying channels.

22. A system as defined in claim 16 wherein the modulation circuit further includes a low frequency signal modulator to increase the stimulated Brillouin scattering threshold of the dispersive fiber optic link.

23. An optical transmitter for generating a modulated optical signal for transmission over a dispersive fiber optic link to a remote receiver comprising:

an input for receiving a broadband analog radio frequency signal input;

a semiconductor laser for producing an optical signal to be transmitted over an optical fiber;

a modulation circuit for directly modulating the laser with the analog signal; and output spectral shaping adjustment means connected to the output of the semiconductor laser for adjusting the average output power of the optical carrier signal so that the power is below that of the stimulated Brillouin scattering threshold of the dispersive fiber optic link.

24. A transmitter as defined in claim 22 wherein the output spectral shaping adjustment means is a phase modulator.

25. A transmitter as defined in claim 22 wherein the output spectral shaping adjustment means is a lithium niobate phase modulator.

26. A transmitter as defined in claim 22 wherein the output spectral shaping adjustment means is a piezoelectric phase modulator.

27. A transmitter as defined in claim 22 wherein the laser is an external cavity laser.

28. A transmitter as defined in claim 22 wherein the wavelength of the light output the laser is in the 1530 to 1570 nm range.

29. A transmitter as defined in claim 22 wherein the broadband analog signal input has a bandwidth greater than one octave and includes a plurality of distinct information carrying channels.

* * * * *